(12) United States Patent
Kim et al.

(10) Patent No.: US 11,796,124 B2
(45) Date of Patent: Oct. 24, 2023

(54) DISPLAY APPARATUS

(71) Applicant: SAMSUNG ELECTRONICS CO., LTD., Suwon-si (KR)

(72) Inventors: Taehun Kim, Suwon-si (KR); Chulyong Cho, Suwon-si (KR); Jisu Kim, Suwon-si (KR); Hyunyong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 240 days.

(21) Appl. No.: 17/031,233

(22) Filed: Sep. 24, 2020

(65) Prior Publication Data

US 2021/0207761 A1 Jul. 8, 2021

(30) Foreign Application Priority Data

Jan. 6, 2020 (KR) .................. 10-2020-0001664

(51) Int. Cl.
*F16M 11/10* (2006.01)
*H05K 5/00* (2006.01)
(Continued)

(52) U.S. Cl.
CPC ......... *F16M 11/105* (2013.01); *F16M 11/041* (2013.01); *F16M 11/14* (2013.01); *F16M 11/18* (2013.01); *F16M 11/2014* (2013.01); *F16M 13/022* (2013.01); *H05K 5/0017* (2013.01); *H05K 5/0217* (2013.01)

(58) Field of Classification Search
None
See application file for complete search history.

(56) References Cited

U.S. PATENT DOCUMENTS

| 5,881,986 A | * | 3/1999 | Hegarty | .................. | A47B 23/02 |
| | | | | | 248/442.2 |
| 6,481,681 B1 | * | 11/2002 | Stunkel | .................. | G06F 1/1601 |
| | | | | | 248/229.11 |

(Continued)

FOREIGN PATENT DOCUMENTS

| CN | 101535920 A | 9/2009 |
| CN | 107430416 A | 12/2017 |

(Continued)

OTHER PUBLICATIONS

International Search Report dated Jan. 26, 2021 from International Application No. PCT/KR2020/012877, 3 pages.

(Continued)

*Primary Examiner* — Xanthia C Cunningham
(74) *Attorney, Agent, or Firm* — STAAS & HALSEY LLP

(57) ABSTRACT

A display apparatus includes a display module, a supporting device provided to support and turn the display module, and a holding device provided for a mobile device to be coupled to the display module. The supporting device rotatably supports the display module and includes a motor providing a driving force to turn the display module. The holding device supports a mobile device so that the mobile device may be coupled to the display module. The holding device comprises a mounting part provided to be mounted onto the display module and a holder rotatably coupled to the mounting part and provided to support the mobile device.

20 Claims, 16 Drawing Sheets

(51) Int. Cl.
*H05K 5/02* (2006.01)
*F16M 11/04* (2006.01)
*F16M 11/18* (2006.01)
*F16M 11/20* (2006.01)
*F16M 11/14* (2006.01)
*F16M 13/02* (2006.01)

(56) References Cited

U.S. PATENT DOCUMENTS

| | | | | |
|---|---|---|---|---|
| 6,532,146 | B1* | 3/2003 | Duquette | G06F 1/1607 |
| | | | | 361/679.04 |
| 9,153,112 | B1* | 10/2015 | Kiani | A61B 5/02438 |
| 9,441,782 | B2* | 9/2016 | Funk | F16M 13/00 |
| 9,501,096 | B2 | 11/2016 | Sharma et al. | |
| 11,284,526 | B2 | 3/2022 | Kim et al. | |
| 2008/0103637 | A1 | 5/2008 | Bliven et al. | |
| 2009/0053685 | A1* | 2/2009 | Common | G06F 1/1609 |
| | | | | 434/408 |
| 2009/0090825 | A1* | 4/2009 | Jung | G06F 1/1601 |
| | | | | 16/221 |
| 2009/0122474 | A1* | 5/2009 | Mickey | F16M 11/126 |
| | | | | 361/679.04 |
| 2009/0146911 | A1* | 6/2009 | Kang | G06F 1/1601 |
| | | | | 345/1.3 |
| 2009/0262493 | A1 | 10/2009 | Lee et al. | |
| 2012/0037771 | A1* | 2/2012 | Kitchen | G06F 1/1632 |
| | | | | 248/223.41 |
| 2012/0083314 | A1* | 4/2012 | Ng | H04N 7/142 |
| | | | | 455/557 |
| 2013/0092805 | A1* | 4/2013 | Funk | F16M 13/00 |
| | | | | 248/274.1 |
| 2013/0286562 | A1* | 10/2013 | Nakajima | H05K 5/0017 |
| | | | | 361/679.01 |
| 2015/0138711 | A1* | 5/2015 | Relf | G06F 1/1647 |
| | | | | 211/26 |
| 2015/0268916 | A1* | 9/2015 | Eisenberg | H04M 1/72409 |
| | | | | 455/566 |
| 2015/0301559 | A1 | 10/2015 | Wu et al. | |
| 2016/0070302 | A1* | 3/2016 | Matzke | G06F 1/1681 |
| | | | | 361/679.04 |
| 2017/0328517 | A1* | 11/2017 | Wessels | F16M 13/00 |
| 2018/0010622 | A1* | 1/2018 | Wu | H04M 1/04 |
| 2018/0014645 | A1* | 1/2018 | McCrate | F16M 11/041 |
| 2018/0043840 | A1* | 2/2018 | Minn | B60R 11/0241 |
| 2018/0356027 | A1* | 12/2018 | Kim | F16M 11/105 |

FOREIGN PATENT DOCUMENTS

| | | |
|---|---|---|
| CN | 110476419 A | 11/2019 |
| EP | 3 588 942 A1 | 1/2020 |
| JP | 2010-181962 | 8/2010 |
| KR | 10-0399608 | 9/2003 |
| KR | 10-0842530 | 7/2008 |
| KR | 10-2011-0008809 | 1/2011 |
| KR | 10-1060912 | 8/2011 |
| KR | 10-2013-0065979 | 6/2013 |
| KR | 10-2014-0002938 | 1/2014 |
| KR | 10-1670352 | 10/2016 |

OTHER PUBLICATIONS

Extended European Search Report dated Sep. 21, 2022 in International Patent Application No. 20911953.6 (9 pages).
Chinese Office Action dated Sep. 7, 2023 in Chinese Patent Application No. 202080092079.9.

* cited by examiner

DISPLAY APPARATUS

CROSS-REFERENCE TO RELATED APPLICATION

This application is based on and claims priority under 35 U. S. C. § 119 to Korean Patent Application No. 10-2020-0001664 filed on Jan. 6, 2020, in the Korean Intellectual Property Office, the disclosure of which is incorporated herein by reference in its entirety.

BACKGROUND

1. Field of the Invention

The disclosure relates to a display apparatus including a display module, a supporting device for turning and supporting the display module, and a holding device for holding a mobile device onto the display module.

2. Discussion of Related Art

A display apparatus is a kind of output device that visually presents data information such as text, figures, etc., and an image, and may include a display module for displaying images and a supporting device for supporting the display module. The supporting device may be provided to support the display module such that the front surface of the display module, on which images are displayed, may be opposite the viewer.

Recently, there has been growing needs of users for a display apparatus equipped with a camera for the user to capture himself/herself and generate contents or check his/her motions in real time when practicing dancing or doing exercises.

However, with the camera installed in the display apparatus, privacy invasion and security issues may be caused, and the rising expenses due to installation of the camera may lower the salability of the display apparatus.

SUMMARY

The disclosure provides a display apparatus including a display module, a supporting device for rotatably supporting the display module, and a holding device for holding a mobile device onto the display module.

The disclosure also provides a display apparatus capable of using a camera function without including a camera module in the display apparatus, by using a camera module of a mobile device.

The disclosure also provides a display apparatus having a display module automatically paired with a mobile device by supporting the mobile device with a holding device.

The disclosure also provides a display apparatus capable of making touch inputs to a mobile device while the mobile device is supported by a holding device of the display apparatus.

According to an aspect of the disclosure, a display apparatus includes a display module; a supporting device rotatably supporting the display module and including a motor providing driving force to turn the display module; and a holding device supporting a mobile device so that the mobile device is put onto the display module, and mounted onto the display module, wherein the holding device comprises a mounting part provided to be mounted onto the display module and a holder rotatably coupled to the mounting part and provided to support the mobile device.

The holding device may be mounted at any location along edges of the display module.

The holding device may support the mobile device such that a full area of a front surface or a rear surface of the mobile device is positioned outside the display module.

The display module may include a frame defining edges of the display module.

The frame may include a front surface having an end which comes into contact with a screen display region, a side surface connected to the other end of the front surface, inclined backwards from the screen display region, and provided to be larger than the front surface, and a rear surface extending from the side surface toward a rear side of the display module.

The mounting part may include a front supporter provided to contact the front surface of the frame, a side supporter provided to contact the side surface of the frame, a rear supporter provided to contact the rear side of the display module, and an elastic connector connecting the side supporter to the rear supporter.

The elastic connector may be arranged separately from the display module or the frame, and have a shape swollen toward the rear side of the display module.

The holder may be coupled to the mounting part to be turned on a first rotation axis and a second rotation axis crossing the first rotation axis.

The holder may be provided to turn 360° on the first rotation axis, and A rotation range of the holder may be limited when the holder is turned on the second rotation axis.

The holder may be ball jointed with the mounting part to be able to freely turn against the mounting part.

The holding device may further include a rotation guide provided between the mounting part and the holder, and a rotation stopper provided to limit a rotation range of the rotation guide.

The rotation guide may include a first rotation guide provided to be inserted to a rotation guide groove formed at the mounting part, and including a guide hole, and a second rotation guide coupled to the first rotation guide with the rotation stopper placed between the first and second rotation guides, and rotatably coupled to the holder.

The rotation stopper may be provided to be movable within the guide hole, and may include a fastening projection passing through the guide hole and coupled to the rotation guide groove.

The fastening projection may limit a rotation range of the first rotation guide by limiting a movement range of the guide hole.

The holder may include a first supporter provided to support a side of the mobile device and a second supporter provided to support the other side of the mobile device, and The second supporter may be provided to be drawn out from the first supporter.

The holder may further include an elastic member connected to the first and second supporters to elastically bias the second supporter to a direction going toward the first supporter.

According to another aspect of the disclosure, a display apparatus includes a display module; a supporting device rotatably supporting the display module; and a holding device provided for a mobile device configured to be paired with the display module to be put onto the display module, wherein the holding device includes a mounting part provided to be mounted on a frame, a holder coupled to the mounting part and provided to support the mobile device, wherein the holder is provided to be able to turn on a first rotation axis and a second rotation axis crossing the first rotation axis.

The holder may be provided to turn 360° on the first rotation axis, and

A rotation range of the holder may be limited when the holder is turned on the second rotation axis.

The holding device may be provided to be mounted at any location along edges of the display module.

The holding device may support the mobile device such that a full area of a front surface or a rear surface of the mobile device is positioned outside the display module.

According to another aspect of the disclosure, a display apparatus includes a display module; a supporting device rotatably supporting the display module; and a holding device provided for a mobile device configured to be paired with the display module to be put onto the display module, wherein the holding device includes a mounting part provided to be mounted on a frame, a holder coupled to the mounting part and provided to support the mobile device, wherein the holder is provided to be able to freely turn on any rotation axis.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Embodiments and features as described and illustrated in the disclosure are merely examples, and there may be various modifications replacing the embodiments and drawings at the time of filing this application.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or chamber discussed below could be termed a second element, component, region, layer or section without departing from the teachings of the disclosure.

Embodiments of the disclosure will now be described with reference to accompanying drawings.

Figure 1:
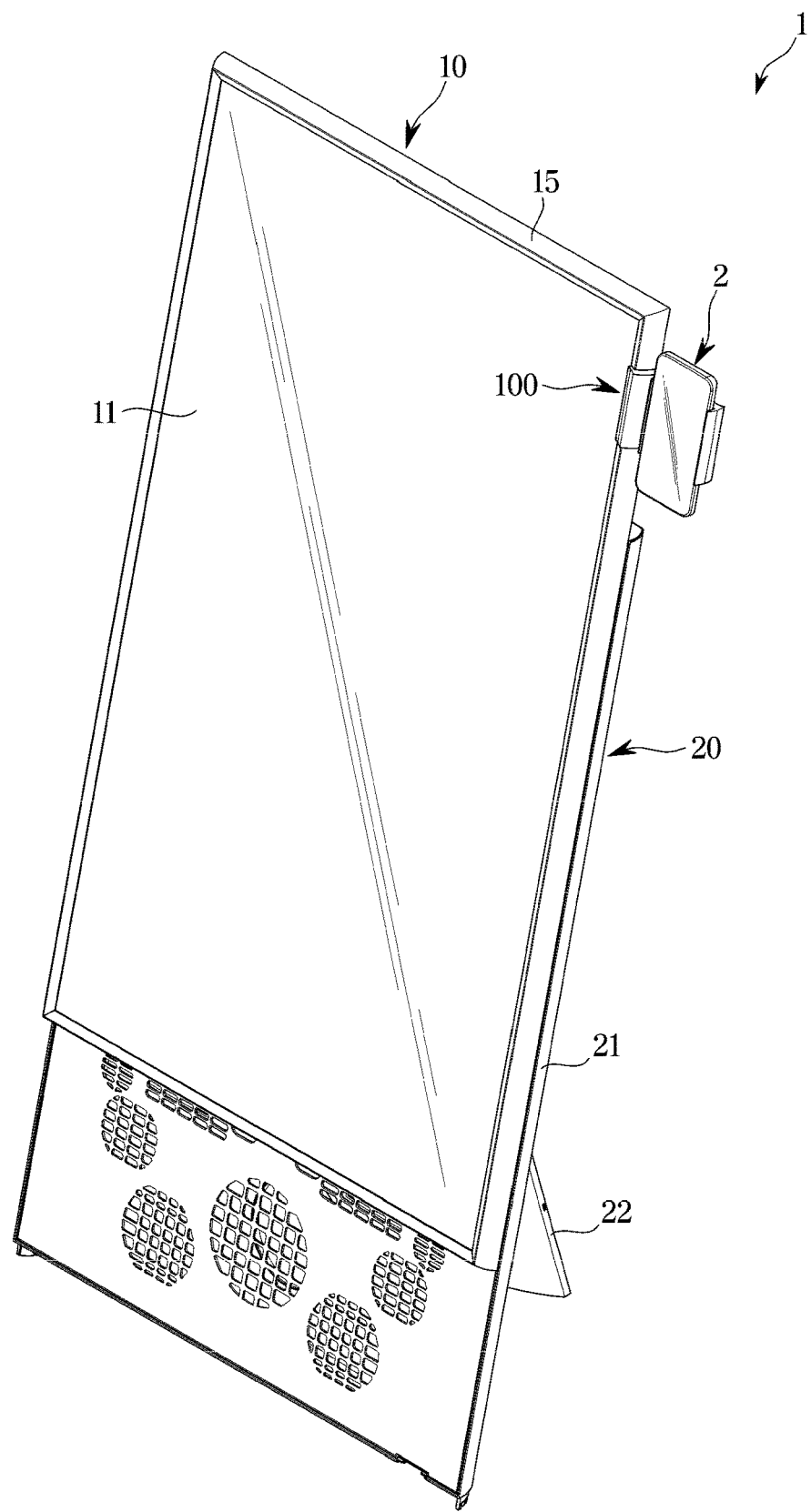
FIG. 1 is a perspective view of a display apparatus, according to an embodiment of the disclosure, where a mobile device is held by a holding device.

FIG. 1 is a perspective view of a display apparatus, according to an embodiment of the disclosure, where a mobile device is held by a holding device.

Referring to FIG. 1, a display apparatus 1 may include a display module 10 for displaying a screen, a supporting device 20 coupled to the rear of the display module 10 for supporting the display module 10, and a holding device 100 coupled to the display module 10 to hold a mobile device 2.

The display module 10 may be a device for displaying information, materials, data, etc., in characters, figures, graphs, images, etc., and may include a television, a monitor, etc.

The display module 10 may be configured to display a screen 11. The display module 10 may include an actively light-emitting display panel (not shown) such as Organic Light Emitting Diodes (OLEDs) or a passively light-emitting display panel (not shown) such as Liquid Crystal Displays (LCDs). There are no particular limitations on the type of display panel.

The display module 10 may be provided to have different vertical and horizontal lengths. That is, the display module 10 may have longer sides and shorter sides. The display module 10 may be shaped like a rectangular plate.

The supporting device 20 may be coupled to the rear of the display module 10 for supporting the display module 10. The supporting device 20 may include a supporting body 21 coupled to the display module 10, and a stand 22 coupled to the rear of the supporting body 21. The supporting device 20 may stand by itself with the supporting body 21 and the stand 22 each contacting the ground.

The supporting device 20 may include a speaker 30 (FIG. 2) provided to produce sounds. The speaker 30 may be arranged inside the supporting body 21. Specifically, the speaker 30 may be arranged in a lower portion within the supporting body 21. The speaker 30 may output a sound with an image displayed in the display module 10. Alternatively, the speaker 30 may output a sound alone even when the display module 10 is powered off. Furthermore, the speaker 30 may be wiredly or wirelessly connected to an external device such as the mobile device 2 for outputting a song played by the external device.

The holding device 100 may be provided to hold the mobile device 2 to be mounted on the display module 10. The holding device 100 may be detachably coupled to the display module 10. The holding device 100 may be coupled to or decoupled from the display module 10 without any extra member.

The mobile device 2 is a kind of external device, including e.g., a smart phone. Mobile devices are widespread these days, and there are attempts to use mobile devices in various ways. Mirroring by which images and sounds presented in the mobile device 2 are output through the display module 10 or casting by which only content output from a particular application of the mobile device 2 is output through the display module 10, are typical examples. To utilize such mirroring or casting, the mobile device 2 and the display apparatus 2 need to be paired first. According to the disclosure, the mobile device 2 and the display apparatus 1 may be paired using various methods, which will be described later.

More and more people create contents by taking selfies with cameras these days. It is also more common for people to check their own motions with their cameras when they practice dancing or doing exercises. As such, there are growing needs of users for a mirror mode that uses the camera and the display screen like a mirror. To provide the mirror mode, however, a camera needs to be installed in the display apparatus, which causes concern over privacy invasion and security issues. Furthermore, the rising expenses due to the installation of the camera may lower the salability of the display apparatus.

According to the disclosure, without installing any camera in the display apparatus 1, the display apparatus 1 may provide the mirror mode. For this, the display apparatus 1 may include the holding device 100. The display apparatus 1 may provide the mirror mode by being paired with the mobile device 2 equipped with a camera module (not shown) put onto the holding apparatus 100. The mobile device 2 commonly includes the camera module, so the display apparatus 1 may provide the mirror mode by using the camera module of the mobile device 2. In this way, using a camera module of an external device such as the mobile device 2, the rise in expenses of camera installation in the display apparatus 1 may be prevented. Furthermore, the mobile device 2 may be used when required by putting the mobile device 2 onto the holding device 100, so the privacy invasion or security issues due to the display device 1 may also be prevented.

According to the disclosure, the holding device 100 may hold the mobile device 2 while the mobile device 2 is placed outside the display module 10. Furthermore, the holding device 100 may hold the mobile device 2 not to cover the front or rear surface of the mobile device 2. In other words, when the mobile device 2 is put onto the holding device 100, a display, the front of the mobile device 2 may not be hidden by the holding device 100. Accordingly, the user may be able to make touch inputs through the display of the mobile device 2 while putting the mobile device 2 onto the holding device 100. The user may also use a camera module placed on the front of the mobile device 2 or a camera module placed on the rear of the mobile device 2 while putting the mobile device 2 onto the holding device 100.

Figure 2:
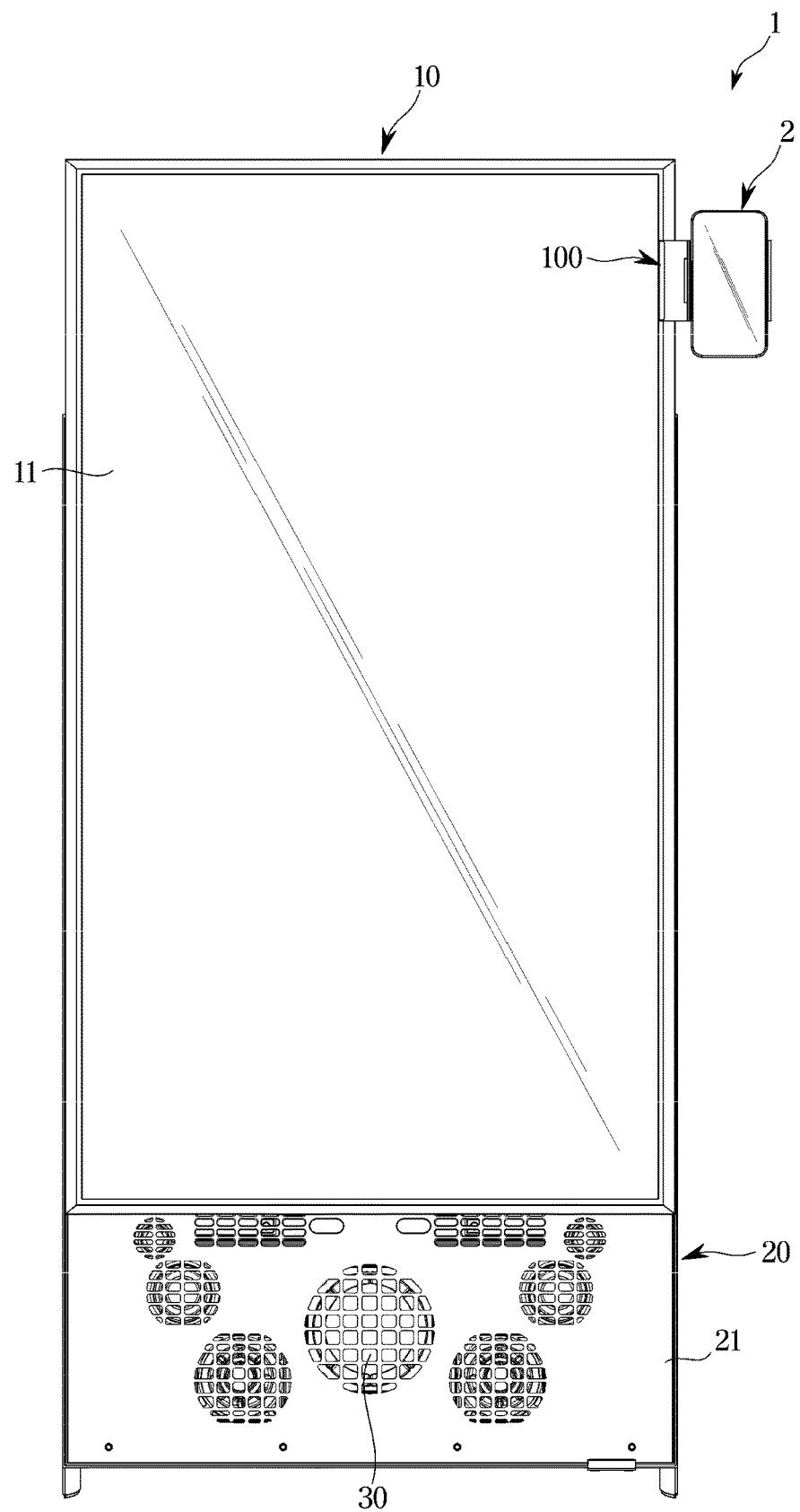
FIG. 2 is a front view of a display apparatus, according to an embodiment of the disclosure, where a display module is positioned lengthwise.
Figure 3:
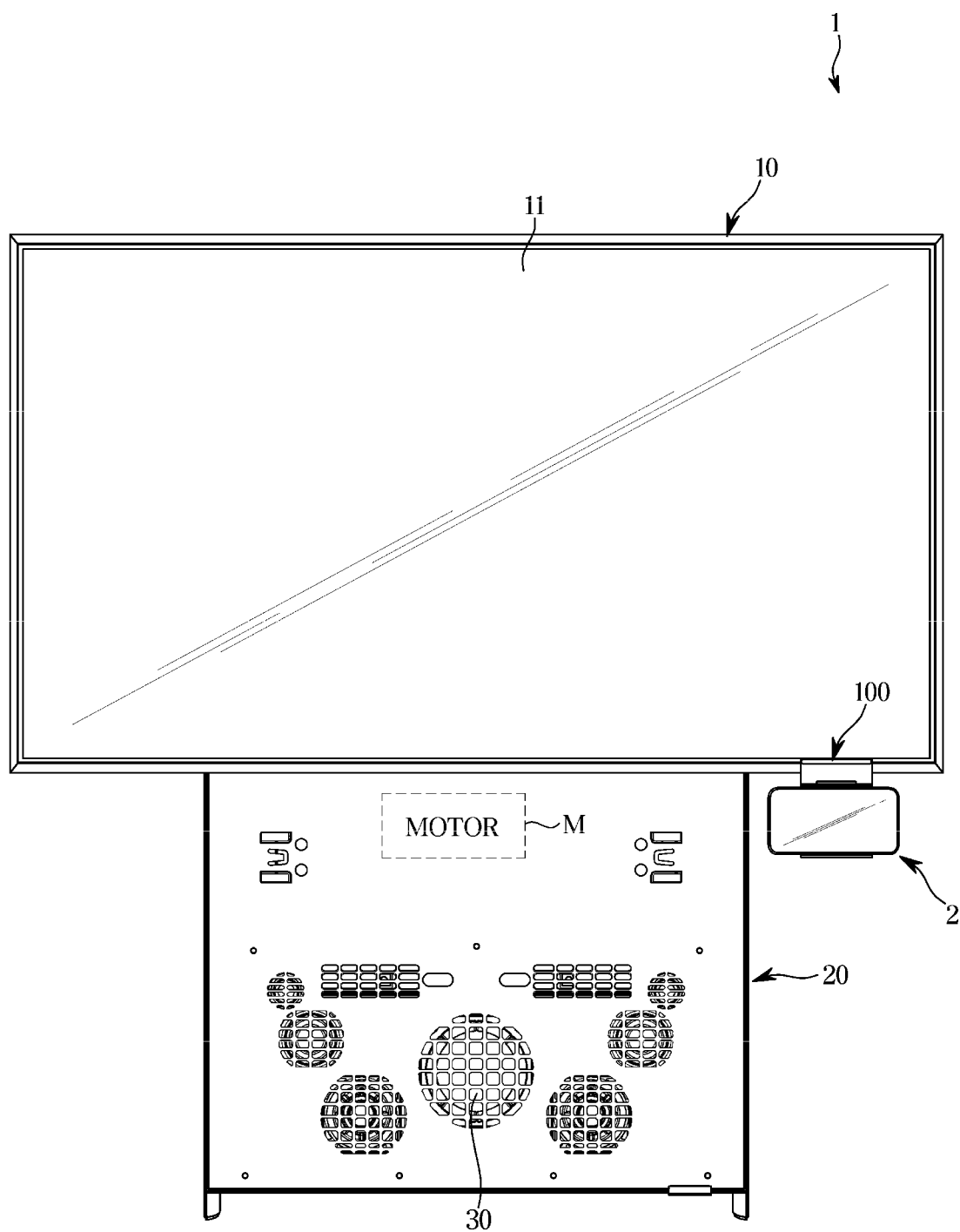
FIG. 3 is a front view of a display apparatus, according to an embodiment of the disclosure, where a display module is positioned widthwise.

FIG. 2 is a front view of a display apparatus, according to an embodiment of the disclosure, where a display module is positioned lengthwise. FIG. 3 is a front view of a display apparatus, according to an embodiment of the disclosure, where a display module is positioned widthwise.

Referring to FIG. 2, the display module 10 may have the longer sides positioned lengthwise and the shorter sides positioned widthwise. This positioning of the display module 10 is hereinafter called lengthwise mode. It is also said that the display module 10 is positioned in a first position.

Referring to FIG. 3, the display module 10 may have the longer sides positioned widthwise and the shorter sides positioned lengthwise. This positioning of the display module 10 is hereinafter called widthwise mode. It is also said that the display module 10 is positioned in a second position.

The user may selectively place the display module 10 in the lengthwise mode or widthwise mode depending on a screen ratio of an image.

It is common for the conventional display module to be fixed widthwise. In this case, when the conventional display module displays a lengthwise image, either side of the screen is blanked, making it impossible to efficiently use the screen of the display module. The lengthwise image and the widthwise image both tend to be used these days, so there is a need for a display apparatus capable of displaying various screen ratios in efficient ways.

In an embodiment of the disclosure, the display apparatus 1 may allow the display module 10 to be positioned in the lengthwise mode to display a lengthwise image and in the widthwise mode to display a widthwise image, thereby efficiently using a screen display region 11. Accordingly, the display apparatus 1 in accordance with the disclosure may efficiently present various screen ratios.

In an embodiment of the disclosure, the display apparatus 1 may include the display module 10 and the supporting device 20 for supporting the display module 10 to be automatically turned by a motor M.

Referring to FIGS. 2 and 3, the display module 10 may be turned from the lengthwise mode into the widthwise mode or vice versa. The supporting device 20 may turn the display module 10 from the lengthwise mode into the widthwise mode or vice versa.

The supporting device 20 may include the motor. The supporting device 20 may turn the display module 10 by using driving force of the motor. Accordingly, the display module 10 may be automatically turned by driving the motor without the need for the user manually turning the display module 10.

According to the disclosure, the holding device 100 may hold the mobile device 10 even when the display module 10 is positioned in the widthwise mode. In other words, the holding device 100 may hold the mobile device 2 to prevent the mobile device 2 from being decoupled from the holding device 100 even when the display module 10 is positioned in the widthwise mode. Accordingly, regardless of positioning of the display module 10, the mobile device 2 may be put onto the display module 10.

The user may selectively position the display module 10 in the lengthwise mode or the widthwise mode, and the display apparatus 1 may provide mirror mode, mirroring, or casting in each of the lengthwise mode and the widthwise mode.

In an embodiment of the disclosure, when the mobile device 2 is put onto the holding device 100a while a widthwise image is reproduced in the mobile device 2, the display module 10 may be positioned in the widthwise mode. When the display module 10 is already positioned in the widthwise mode, the display module 10 may not be turned even when the mobile device 2 is put onto the holding device 100. When the mobile device 2 that is reproducing a widthwise image is put onto the holding device 100 while the display module 10 is positioned in the lengthwise mode, the display module 10 may be turned into the widthwise mode from the lengthwise mode. This may enable early detection of the user's mirroring or casting intention and increase user convenience.

As shown in FIGS. 1 to 3, the speaker 30 may be placed below the display module 10. The speaker 30 may be arranged not to be covered by the display module 10 even positioned in the lengthwise mode. This enables the speaker 30 to output sound stably regardless of the positioning of the display module 10. Furthermore, although the speaker 30 is shown as being viewed from outside of the supporting device 20, there may be a metal cover or fabric cover with multiple holes provided in front of the speaker 30.

In an embodiment of the disclosure, the holding device 100 included in the display apparatus 1 may be detachably mounted onto the display module 10. The holding device 100 may be mounted onto or detached from the display module 10 without any extra member.

The holding device 100 may be mounted on a flank of the display module 10 when the display module 10 is positioned lengthwise. The holding device 100 may be mounted on an upper portion of a flank of the display module 10 not to interfere with the supporting device 20 when the display module 10 is turning into the widthwise mode from the lengthwise mode.

Furthermore, unlike what is shown in the drawings, the holding device 100 may be mounted on a flank of the display module 10 when the display module 10 is positioned widthwise. In other words, when the display module 10 is positioned lengthwise, the holding device 100 may be mounted on the top of the display module 10.

It is desirable for the holding device 100 to be above the top of the supporting device 20 when the display module 10 is positioned lengthwise, but it is not limited thereto. Even when the holding device 100 is mounted onto the display module 10, it may not interfere with turning of the display module 10. When the holding device 100 is provided to be accommodated in a space formed between the rear surface of the display module 10 and the front surface of the supporting device 20, the mounting position of the holding device 100 is not limited. In this case, the holding device 100 may be freely mounted at any location along the edges of the display module 10.

Figure 4:
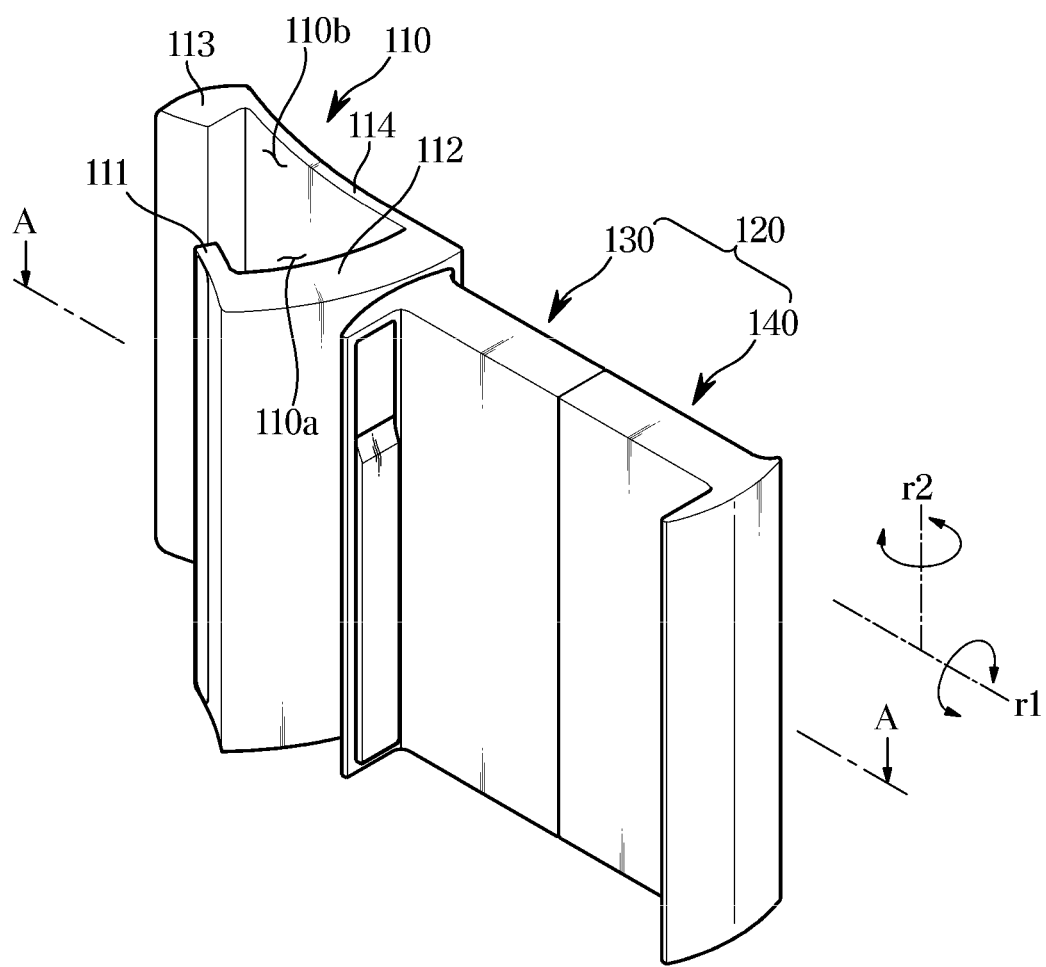
FIG. 4 shows a holding device separated from a display apparatus, according to an embodiment of the disclosure.
Figure 5:
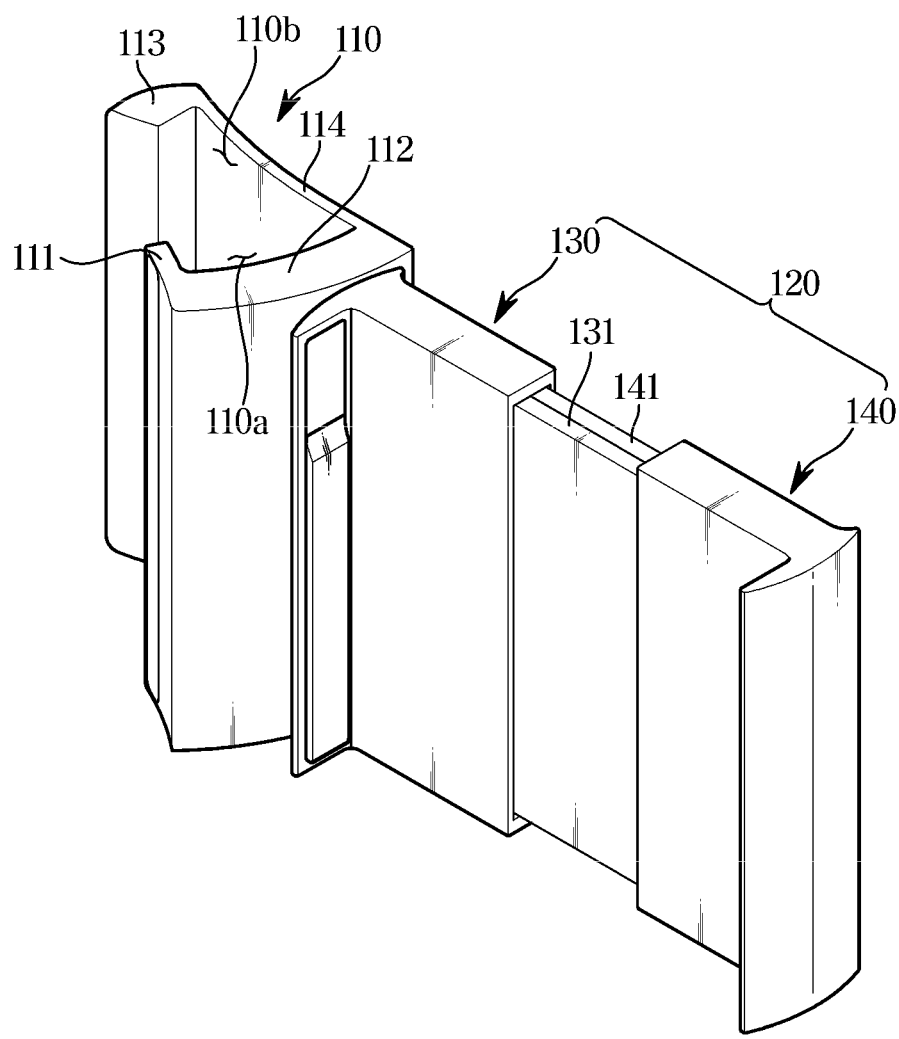
FIG. 5 shows a second supporter drawn out from the holding device shown in FIG. 4.

FIG. 4 shows a holding device of a display apparatus, according to an embodiment of the disclosure. FIG. 5 shows a second supporter drawn out from the holding device shown in FIG. 4.

Referring to FIGS. 4 and 5, the holding device 100 may include a mounting part 110 provided to be mounted on a frame 15 (see FIG. 1) of the display module 10, and a holder 120 rotatably coupled to the mounting part 110 and provided to hold the mobile device 2. The frame 15 may be provided to form edges of the display module 10.

Figure 10:
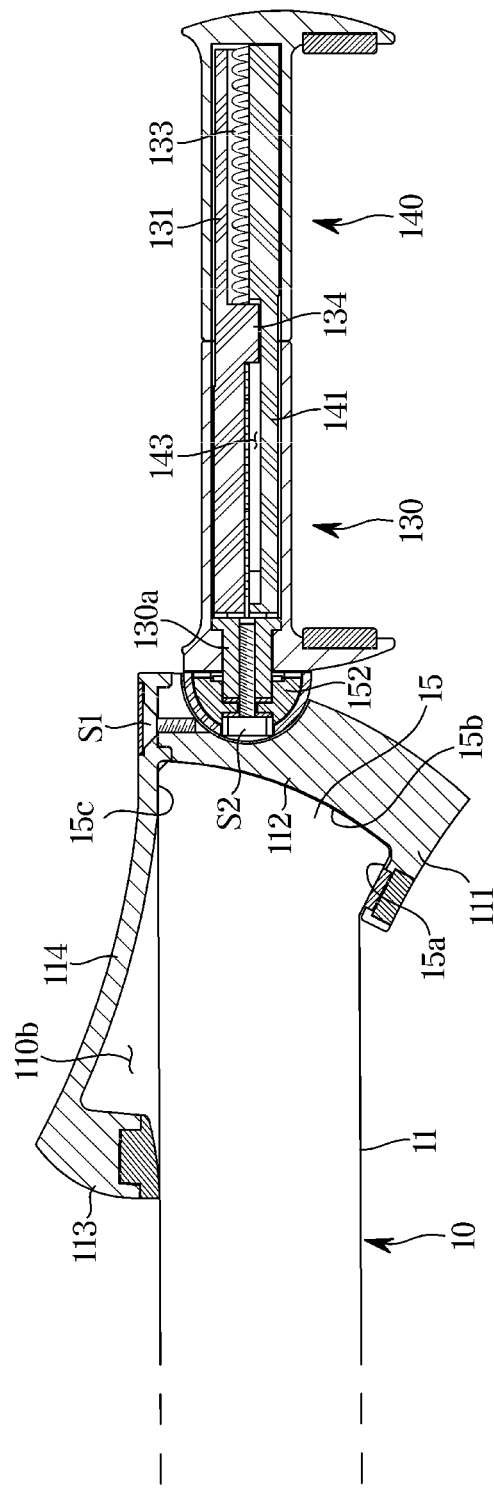
FIG. 10 is a cross-sectional view along line A-A of FIG. 4.

The frame 15 may include a front surface 15a, a side surface 15b, and a rear surface 15c (see FIG. 10). In an embodiment of the disclosure, the front surface 15a of the frame 15 may be provided to come into contact with the screen display region 11. The front surface 15a of the frame 15 may protrude forward from the screen display region 11 and incline outward from the screen display region 11. The side surface 15b of the frame 15 may be linked to the front surface 15a of the frame 15 and may incline rearward from the screen display region 11. The side surface 15b of the frame 15 may be larger than the front surface 15a of the frame 15. The rear surface 15c of the frame 15 may extend from the side surface 15b of the frame 15 toward the rear side of the display module 10.

The mounting part 110 may be provided to be mounted onto the frame 15 of the display module 10. The mounting part 110 may be mounted onto the display module 10 without any extra member, and detached from the display module 10 without any extra member.

The mounting part 110 may include a mounting groove 110a shaped to correspond to the cross-section of the frame 15 of the display module 10, and an elastic groove 110b formed at a distance from the rear side of the display module 10. Furthermore, the mounting part 110 may include a front supporter 111 to support the front of the frame 15, a side supporter 112 to support the flank of the frame 15, a rear supporter 113 to support the rear side of the display module 10, and an elastic connector 114 to connect the side supporter 112 and the rear supporter 113.

The mounting groove 110a may be defined by the front supporter 111, the side supporter 112, and a portion of the elastic connector 114. The elastic groove 110b may be defined by the rear supporter 113 and the rest of the elastic connector 114.

The front supporter 111 may correspond to the front surface of the frame 15 to support the front surface of the frame 15. The side supporter 112 may correspond to the side surface of the frame 15 to support the side surface of the frame 15. The rear supporter 113 may come into contact with a portion of the rear side of the display module 10 to support the rear side of the display module 10.

The elastic connector 114 may be provided to connect the side supporter 112 to the rear supporter 113. The elastic connector 114 may have a curved cross-section. Specifically, the elastic connector 114 may have a swollen form toward the rear side of the display module 10. The elastic connector 114 may have substantially constant thickness. With the constant thickness and curved form of the elastic connector 114, the elastic groove 110b may be formed between the rear side of the display module 10 and the elastic connector 114. While the front supporter 111 and the side supporter 112 may come into contact with the front and flank of the frame 15, the elastic connector 114 may not contact the frame 15 or the display module 10.

With the curved form, the elastic connector 114 may not be broken even when the rear supporter 113 is moved a certain distance in a direction away from the rear side of the display module 10. Due to the curved form, elastic limits of the elastic connector 114 may increase. With the increase in the elastic limits of the elastic connector 114, the distance for the rear supporter 113 to be moved backwards from the display module 10 may increase.

When the holding device 100 is to be mounted onto or detached from the display module 10, the rear supporter 113 needs to be moved back, in which case due to the curved form of the elastic connector 114, the elastic limits of the elastic connector 114 may increase and the distance for the rear supporter 113 to be moved backwards may increase accordingly. Furthermore, the elastic connector 114 may secure the holding device 100 to the display module 10 by applying tension for the rear supporter 113 to be moved forwards even after the holding device 100 is mounted onto the display module 10. Hence, the holding device 100 may secure the display module 10 to the holding device 100 with restoring force of the elastic connector 14 to restore to its original state after the elastic connector 114 is elastically deformed.

The holder 120 may support the mobile device 2 to prevent the mobile device 2 from being decoupled from the holding device 100.

Referring to FIGS. 4 and 5, the holder 120 may include a first supporter 130 provided to support a side of the mobile device 2 and a second supporter 140 provided to support the other side of the mobile device 2. The first supporter 130 may be coupled to the mounting part 110. The second supporter 140 may slidingly move with respect to the first supporter 130. The second supporter 140 may be able to slide within a certain range in a direction away from the first supporter 130. Hereinafter, the second supporter 140 sliding in the direction away from the first supporter 130 may be expressed as the second supporter 140 being drawn out.

As shown in FIG. 4, the first and second supporters 130 and 140 may be provided to come into contact with each other. As will be described later, with no external force applied, the first and second supporters 140 may contact each other or may be located closest to each other due to elastic force of an elastic member. When the first and second supporters 130 and 140 are located closest to each other, the distance between the first and second supporters 130 and 140 may be set to be less than the left-to-right length of the mobile device 2.

As shown in FIG. 5, with external force applied, the second supporter 140 may move away from the first supporter 130. When the first and second supporters 130 and 140 are located farthest from each other, the distance between the first and second supporters 130 and 140 may be set to be greater than common left-to-right length of the mobile device 2.

The user may move the second supporter 140 such that the distance between the first and second supporters 130 and 140 becomes wider, and then place the mobile device 2 between the first and second supporters 130 and 140. When the force to the second supporter 140 is released after the mobile device is placed between the first and second supporters 130 and 140, the second supporter 140 may move to the first supporter 130 due to elastic force and the mobile device 2 may be supported by the first and second supporters 130 and 140. Structures of the first and second supporters 130 and 140 will be described later in detail.

Figure 6:
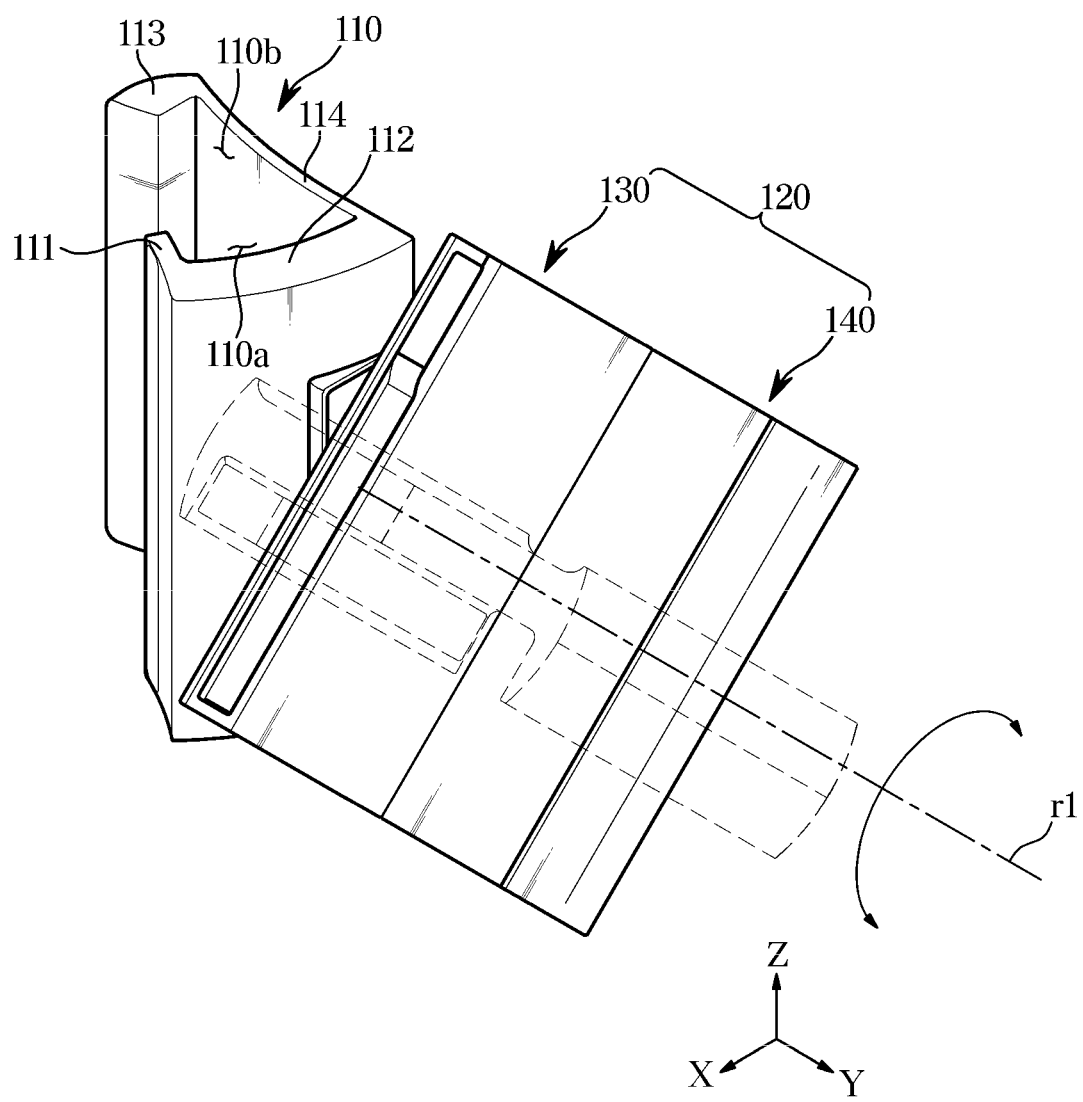
FIG. 6 shows a holder turning in a first direction with respect to an mounting part in the holding device shown in FIG. 4.
Figure 7:
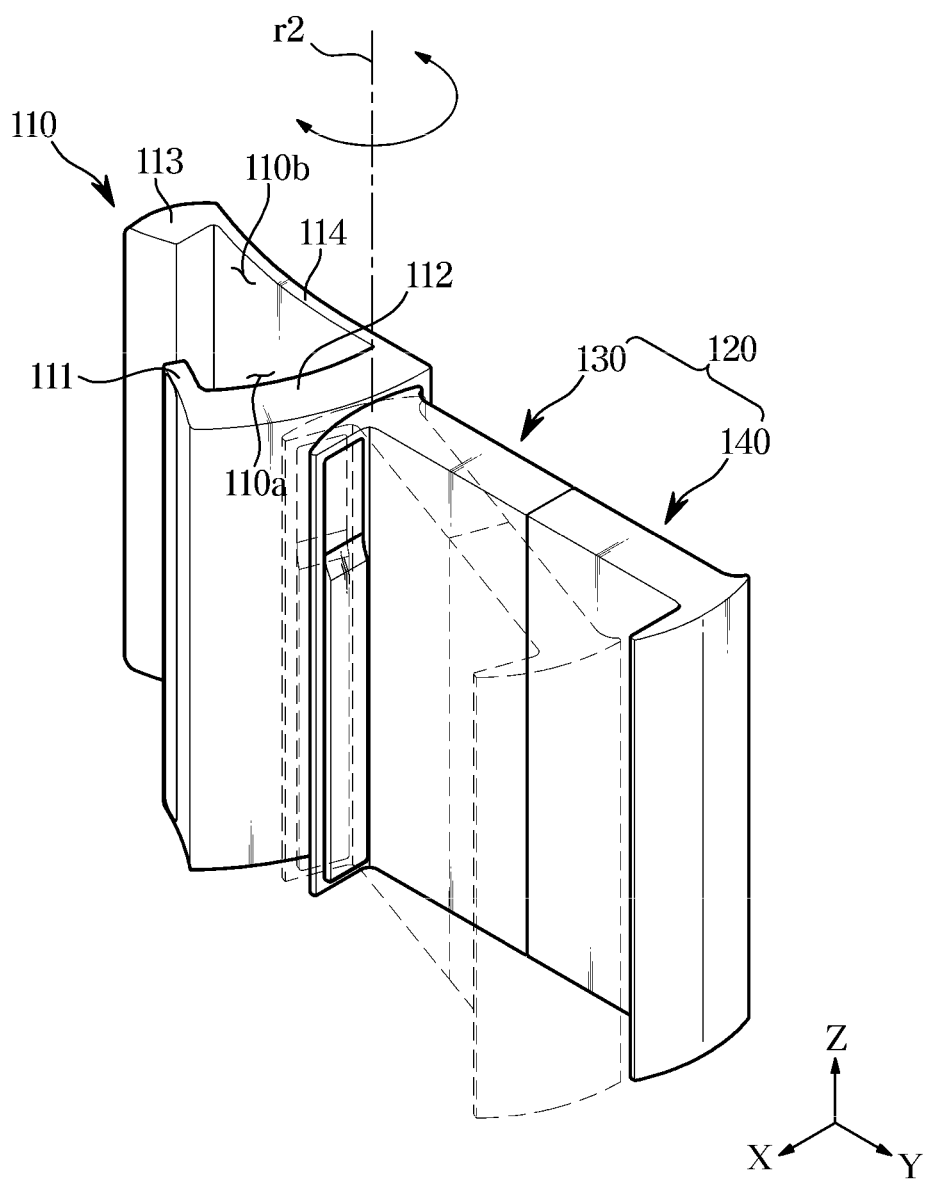
FIG. 7 shows the holder turning in a second direction with respect to an mounting part in the holding device shown in FIG. 4.

FIG. 6 shows a holder turning in a first direction with respect to a mounting part in the holding device shown in FIG. 4. FIG. 7 shows the holder turning in a second direction with respect to a mounting part in the holding device shown in FIG. 4.

Referring to FIGS. 6 and 7, in an embodiment of the disclosure, in the holding device 100, the holder 120 may be rotatably coupled to the mounting part 110. The holder 120 may be rotated in a first direction and a second direction crossing the first direction while coupled to the mounting part 110.

Referring to FIG. 6, the holder 120 may be rotated around a first rotation axis r1. The first rotation axis r1 may refer to a straight line parallel to the y-axis shown in the drawings. The holder 120 may be provided to be able to rotate 360 degrees around the first rotation axis r1, without limitations on the rotation range.

Referring to FIG. 7, the holder 120 may be rotated around the second rotation axis r2 that crosses the first rotation axis r1. The second rotation axis r2 may refer to a straight line parallel to the z-axis shown in the drawings. The holder 120 may be provided to be able to rotate around the first rotation axis r1 within a certain rotation angle. The holder 120 may be provided to have a limited rotation range when rotating around the second rotation axis r2. This will be described in more detail later.

Figure 8:
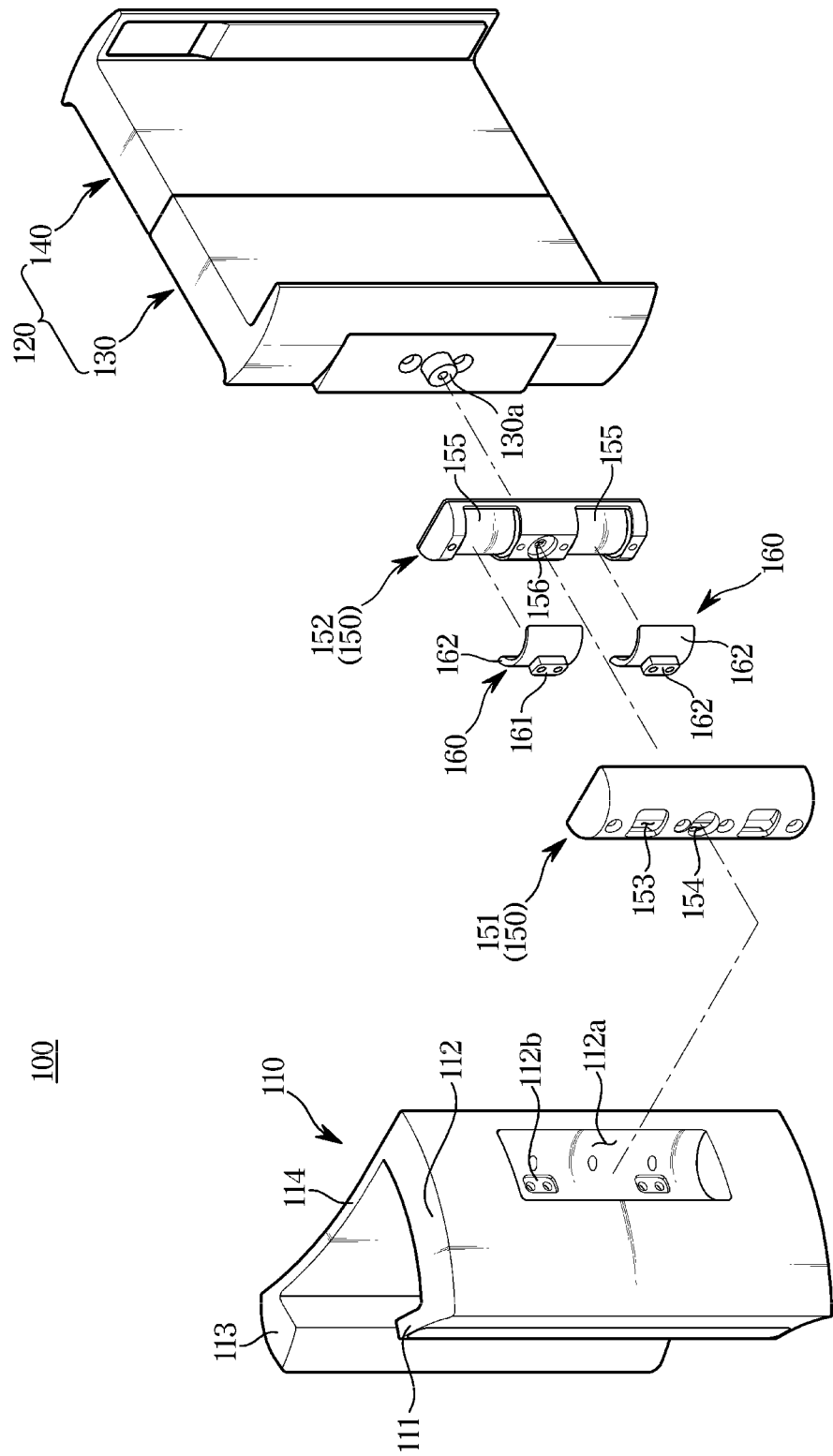
FIG. 8 is an exploded view of a holding device in a display apparatus, according to an embodiment of the disclosure.
Figure 9:
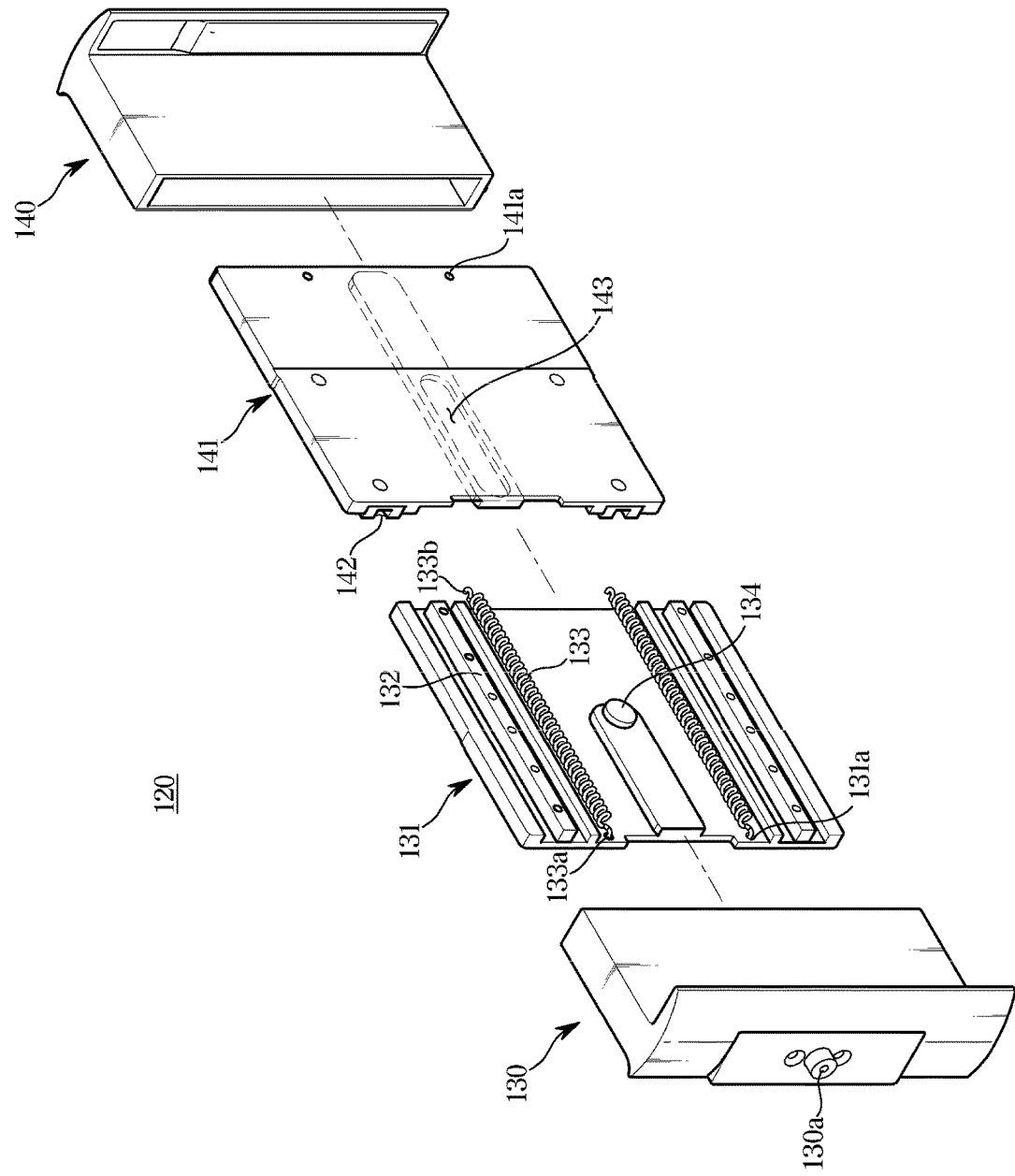
FIG. 9 is an exploded view of a holder of the holding device shown in FIG. 8.

FIG. 8 is an exploded view of a holding device in a display apparatus, according to an embodiment of the disclosure. FIG. 9 is an exploded view of a holder of the holding device shown in FIG. 8.

A structure of the holding device 100 according to an embodiment of the disclosure will now be described in detail in connection with FIGS. 8 and 9.

As described above, the mounting part 110 may include the front supporter 111, the side supporter 112, the rear supporter 113, and the elastic connector 114. The front supporter 111 and the side supporter 112 may define the mounting groove 110a corresponding to the shape of the frame 15. Furthermore, in an embodiment of the disclosure, the side supporter 112 may include a rotation guide groove 112a. The rotation guide groove 112a will be described later.

The holding device 100 may include a rotation guide 150 and a rotation stopper 160, which are provided to rotatably couple the holder 120 to the mounting part 110.

The rotation stopper 160 may include a stopper body 162 having a cross-section shaped like a half circle, and a fastening projection 161 protruding from the stopper body 162 and allowing a fastening member (not shown) to be fastened thereto.

The rotation stopper 160 may be coupled to the rotation guide groove 112a of the mounting part 110. Specifically, the fastening projection 161 may be coupled by the fastening member to a fastening part 112b provided at the rotation guide groove 112a.

The rotation guide 150 may include a first rotation guide 151 and a second rotation guide 152. The rotation stopper 160 may be arranged between the first and second rotation guides 151 and 152.

The first rotation guide 151 may include a guide hole 153 formed for the fastening projection 161 of the rotation stopper 160 to be inserted thereto, and a first fastening hole 154 formed for a fastening member S2 (see FIG. 10), which will be described later, to be inserted thereto. As shown in the drawings, to improve coupling stability, the guide hole 153 may be provided in a pair, but there are no limitations on the number of guide holes 153.

The first rotation guide 151 may have a shape corresponding to the rotation guide groove 112a. The rotation guide groove 112a and the first rotation guide 151 may have a substantially half-cylindrical shape.

The first rotation guide 151 may include the guide hole 153 and the first fastening hole 154. The fastening projection 161 of the rotation stopper 160 may be inserted to the guide hole 153. The guide hole 153 may restrict a movement range of the rotation stopper 160. The fastening projection 161 may be moved within a range of the guide hole 153, thereby restricting the rotation range around the second rotation axis r2 of the holder 120. The fastening member S2 may be inserted to the first fastening hole 154. The fastening member S2 may pass through the first fastening hole 154 to be coupled to a shaft 130a.

The second rotation guide 152 may include a guide groove 155 formed for the rotation stopper 160 to be inserted thereto, and a second fastening hole 156 formed for the fastening member S2 to be inserted thereto.

The guide groove 155 may have the form of an arch to correspond to the stopper body 162. The stopper body 162 may be movable within the guide groove 155. The guide groove 155 may restrict the movement range of the stopper body 162.

The fastening member S2 may be inserted to the second fastening hole 156. To prevent the fastening member S2 from penetrating the second fastening hole 156, the diameter of the second fastening hole 156 may be set to be smaller than a head part of the fastening member S2. A groove may be formed around the second fastening hole 156 for the head part of the fastening member S2 to be inserted to.

The first and second rotation guides 151 and 152 may be coupled to each other by a fastening member (not shown) with the rotation stopper 160 placed between them. As shown in the drawings, the rotation stopper 160 may be provided in a pair. There may be a number of the guide holes 153 and the guide grooves 155 corresponding to the number of the rotation stoppers 160.

The holder 120 may include the shaft 130a. The shaft 130a may be coupled to the rotation guide 150. The shaft 130a may be a rotation axis of the holder 120 when the holder 120 is turned on the first rotation axis.

Referring to FIG. 9, in an embodiment of the disclosure, the holder 120 of the holding device 100 may include the first supporter 130, a first rail plate 131 coupled to the first supporter 130, the second supporter 140, and a second rail plate 141 coupled to the second supporter 140.

The first supporter 130 may include the shaft 130a as described above. The first supporter 130 may be rotatably coupled to the mounting part 110 through the shaft 130a.

The first rail plate 131 may be coupled to the first supporter 130 inside the first supporter 130. The first rail plate 131 may include a pair of rails 132 arranged separately in the vertical direction. The reason of having a pair of rails 132 is for smooth sliding of the second supporter 140, and the number of the rails 132 may be fewer or more than two.

The first rail plate 131 may include a stopper 134 to restrict the movement range of the second supporter 140. The stopper 134 may be formed to protrude toward a second plate 141, which will be described below, from a surface of the first rail plate 131.

The second rail plate 141 may be coupled to the second supporter 140 inside the second supporter 140. The second rail plate 141 may include rail guides 142 corresponding to the rails 132 of the first rail plate 131. The rail guides 142 may be provided in a pair to correspond to the number of the rails 132, and similar to the rails 132, the number of the rail guides 142 may be variable.

The second rail plate 141 may include a stopper groove 143 formed for the stopper 134 to be inserted thereto. When the second supporter 140 is drawn out, the stopper 134 remains fixed while the stopper groove 143 is moved along with the second rail plate 141. The second supporter 140 may be moved until the stopper 134 reaches an end of the stopper groove 143, and after the stopper 134 reaches the end of the stopper groove 143, the movement of the second supporter 140 may be restricted because the stopper 134 is caught in the stopper groove 143.

In the embodiment of the disclosure, a first elastic member 133 may be provided between the first and second rail plates 131 and 141. The first elastic member 133 may have an end 133a inserted to a first elastic member hole 131a formed at the first rail plate 131. The first elastic member 133 may have the other end 133b inserted to a second elastic member hole 141a formed at the second rail plate 141. There are no limitations on types of the first elastic member 133, but in an embodiment of the disclosure, the first elastic member 133 may be a tension spring.

The first elastic member 133 may be provided to be elastically deformed when the second supporter 140 is moved in a direction away from the first supporter 130. The first elastic member 133 may be provided to exert elastic force to a direction in which the second supporter 140 approaches the first supporter 130. Accordingly, the user may draw out the second supporter 140 by applying force equal to or greater than the elastic force of the first elastic member 133, to place the mobile device 2 between the first and second supporters 130 and 140. When the user releases the force applied to the second supporter 140, the first and second supporters 130 and 140 may hold the mobile device 2 by elastic force of the first elastic member 133.

FIG. 10 is a cross-sectional view along line A-A of FIG. 4.

In FIG. 10, the structure of the mounting part 110 is shown more clearly. As shown in FIG. 10, the mounting part 110 may be formed with a first member defining the front supporter 111 and the side supporter 112 and a second member defining the rear supporter 113 and the elastic connector 114. The first member and the second member may be coupled to each other by a fastening member S1 as shown in FIG. 10. It is, however, an example, and in the mounting part 110, the front supporter 111, the side supporter 112, the rear supporter 113, and the elastic connector 114 may be integrated in one body.

Furthermore, referring to FIG. 10, the fastening member S2, as described above, may be coupled to the shaft 130a by passing through the first and second rotation guides 151 and 152. Moreover, the second supporter 140 may be moved until the stopper 134 reaches an end of the stopper groove 143.

Figure 11:
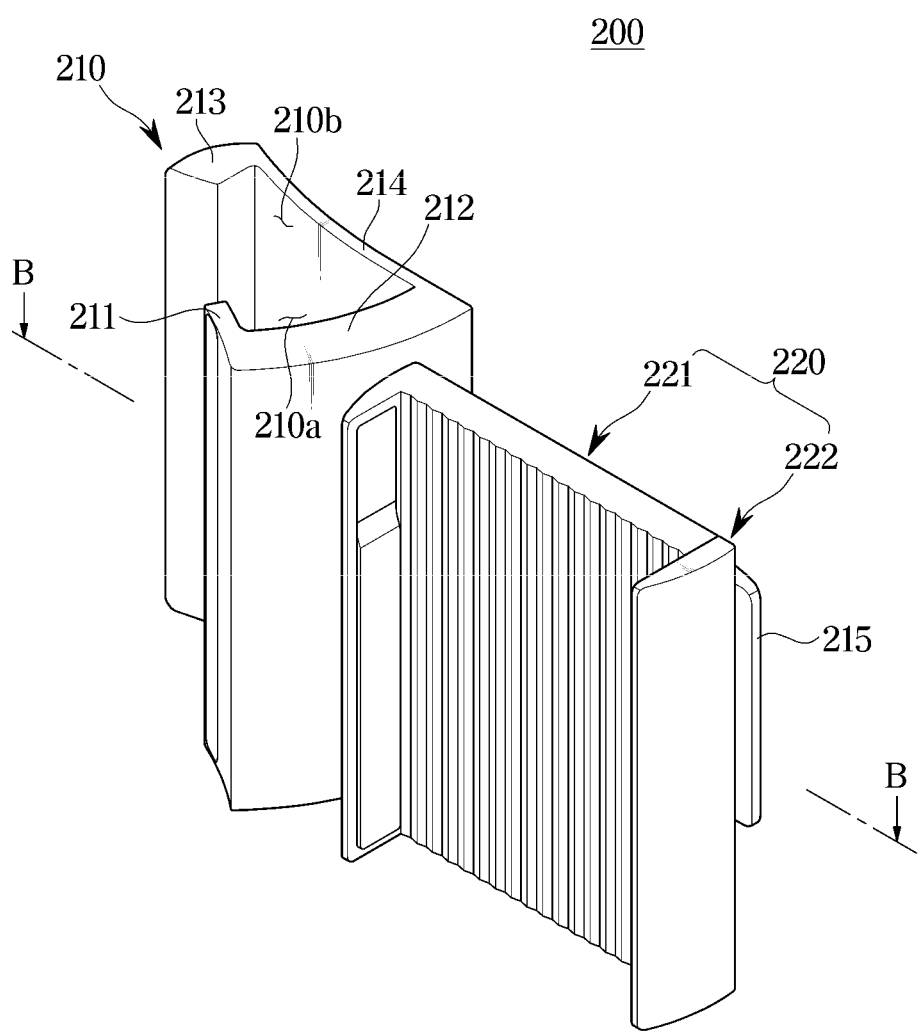
FIG. 11 shows a holding device separated from a display apparatus, according to another embodiment of the disclosure.
Figure 12:
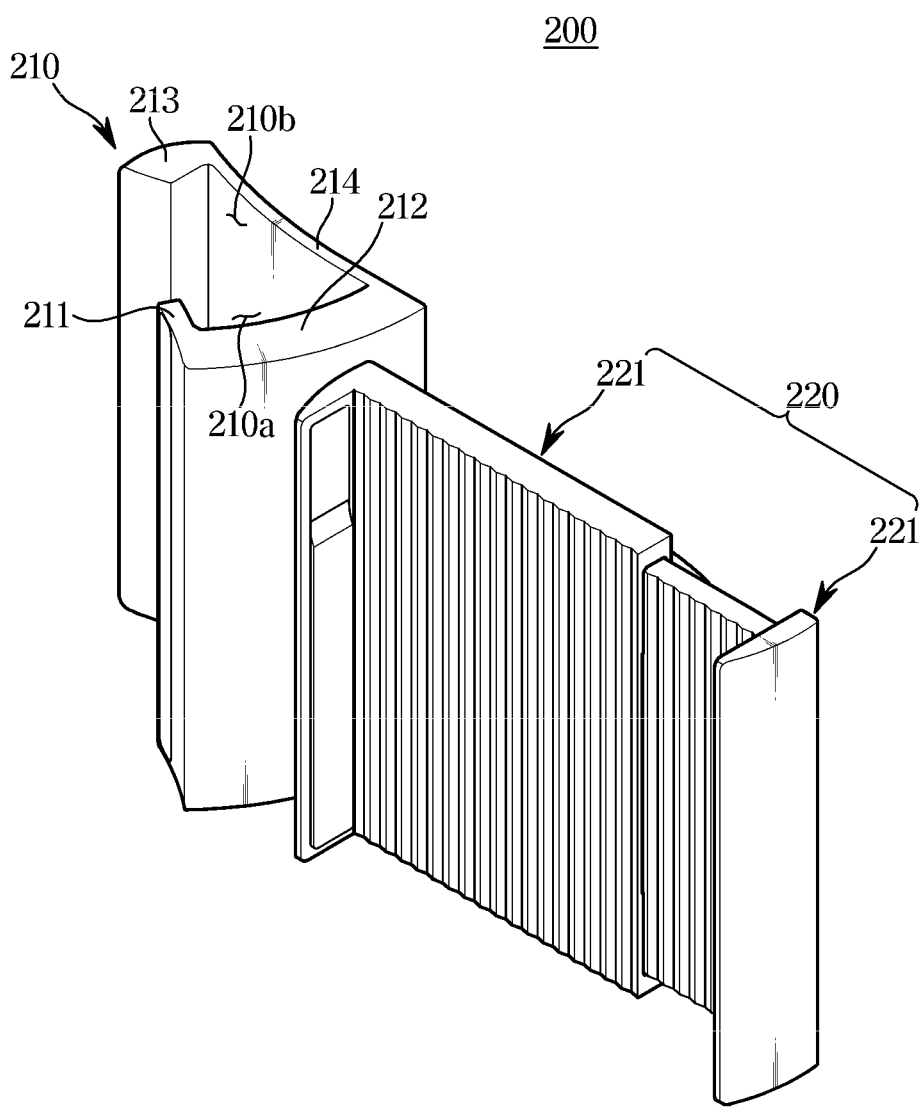
FIG. 12 shows a second supporter drawn out from the holding device shown in FIG. 11.

FIG. 11 shows a holding device separated from a display apparatus, according to another embodiment of the disclosure. FIG. 12 shows a second supporter drawn out from the holding device shown in FIG. 11.

Referring to FIGS. 11 and 12, in another embodiment of the disclosure, a holding device 200 may include a mounting part 210 mounted on the display module 10, and a holder 220 including a first supporter 221 and a second supporter 222 provided to be drawn out from the first supporter 221.

The mounting part 210 may include a front supporter 211 to support the front of the frame 15, a side supporter 222 to support the flank of the frame 15, a rear supporter 213 to contact the rear side of the display module 10 to apply elastic force to the rear side of the display module 10, and an elastic connector 214 to connect the side supporter 212 and the rear supporter 213. A mounting groove 210a may be formed between the front supporter 211 and the side supporter 212, and an elastic groove 210b may be formed between the rear supporter 213 and the elastic connector 214. What are described above in relation to the mounting part 210 will not be repeated.

In this embodiment of the disclosure, the second supporter 222 may be drawn in the first supporter 221, as shown in FIG. 11. When the second supporter 222 is drawn in the first supporter 221, the distance between the first and second supporters 221 and 222 may be a minimum distance.

As shown in FIG. 12, the second supporter 222 may be drawn out from the first supporter 221 by external force. The second supporter 222 may be moved in a direction of being drawn in the first supporter 221 by elastic force of the elastic member. With the elastic force of the elastic member, the mobile device 2 may be held between the first and second supporters 221 and 222.

Figure 13:
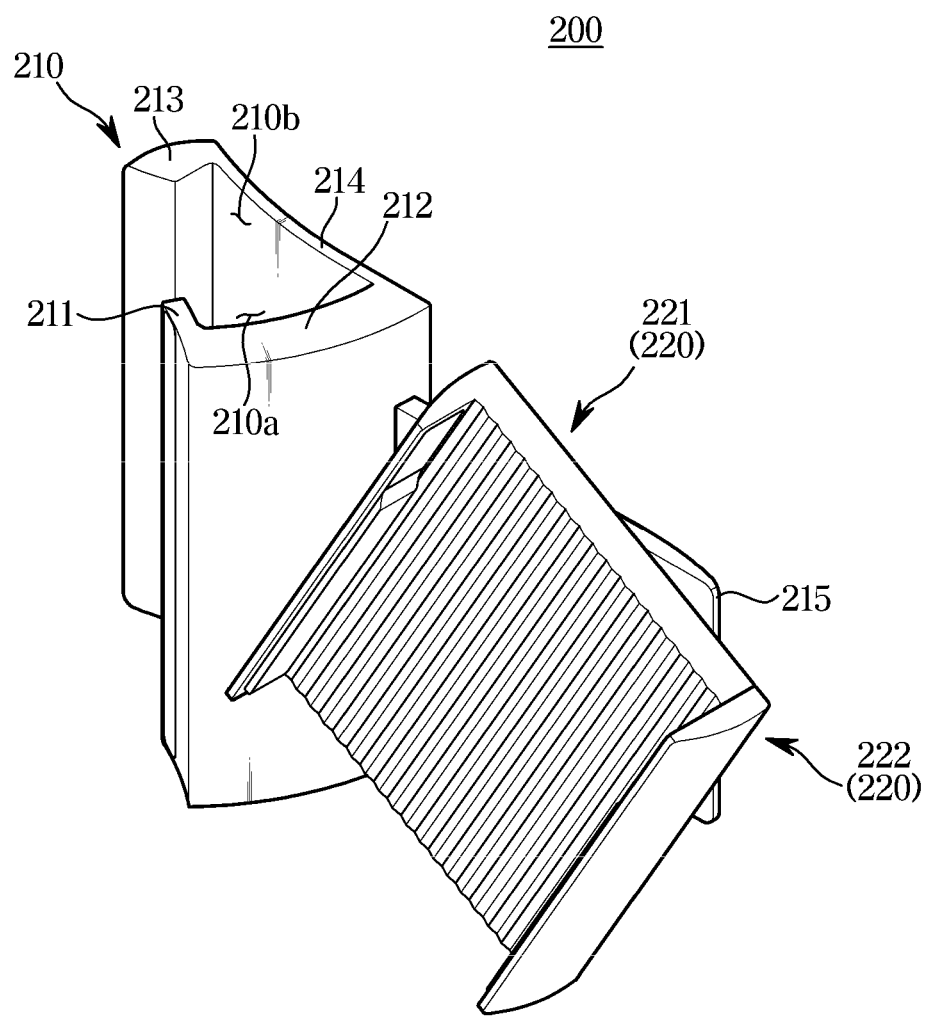
FIG. 13 shows the holding device shown in FIG. 11 with a holder turning round.

FIG. 13 shows the holding device shown in FIG. 11 with a holder turning round.

Referring to FIG. 13, in another embodiment of the disclosure, in the holding device 200, a holder 220 may be rotatably coupled to a holder supporter 215 of the mounting part 210. The holder supporter 215 may be formed by extending laterally from the mounting part 210. The holder 220 may be coupled to the holder supporter 215 by ball joint. Accordingly, the holder 220 may be freely turned against the holder supporter 215. In other words, the rotation axis of the holder 220 may not be fixed. The holder 220 may be provided to freely turn on any rotation axis.

Figure 14:
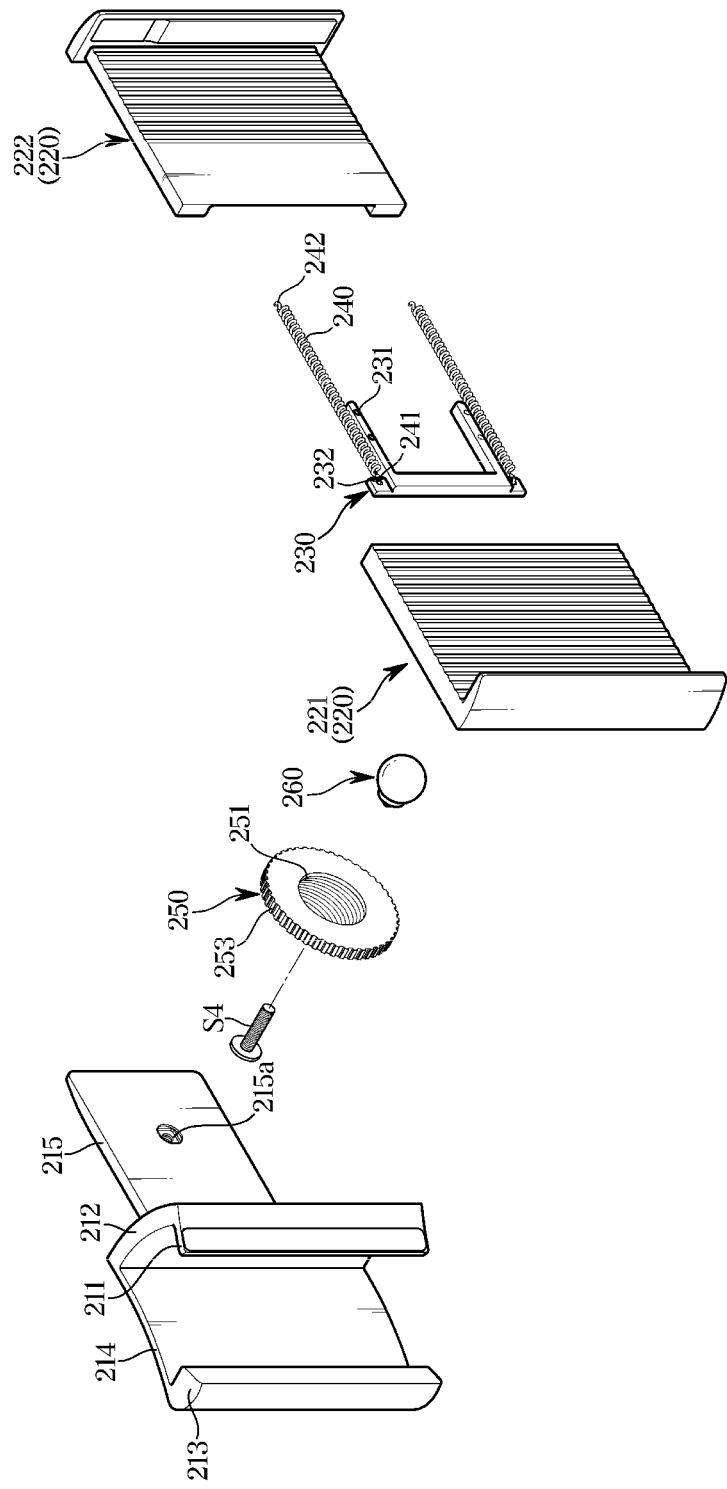
FIG. 14 is an exploded view of a holding device in a display apparatus, according to another embodiment of the disclosure.
Figure 15:
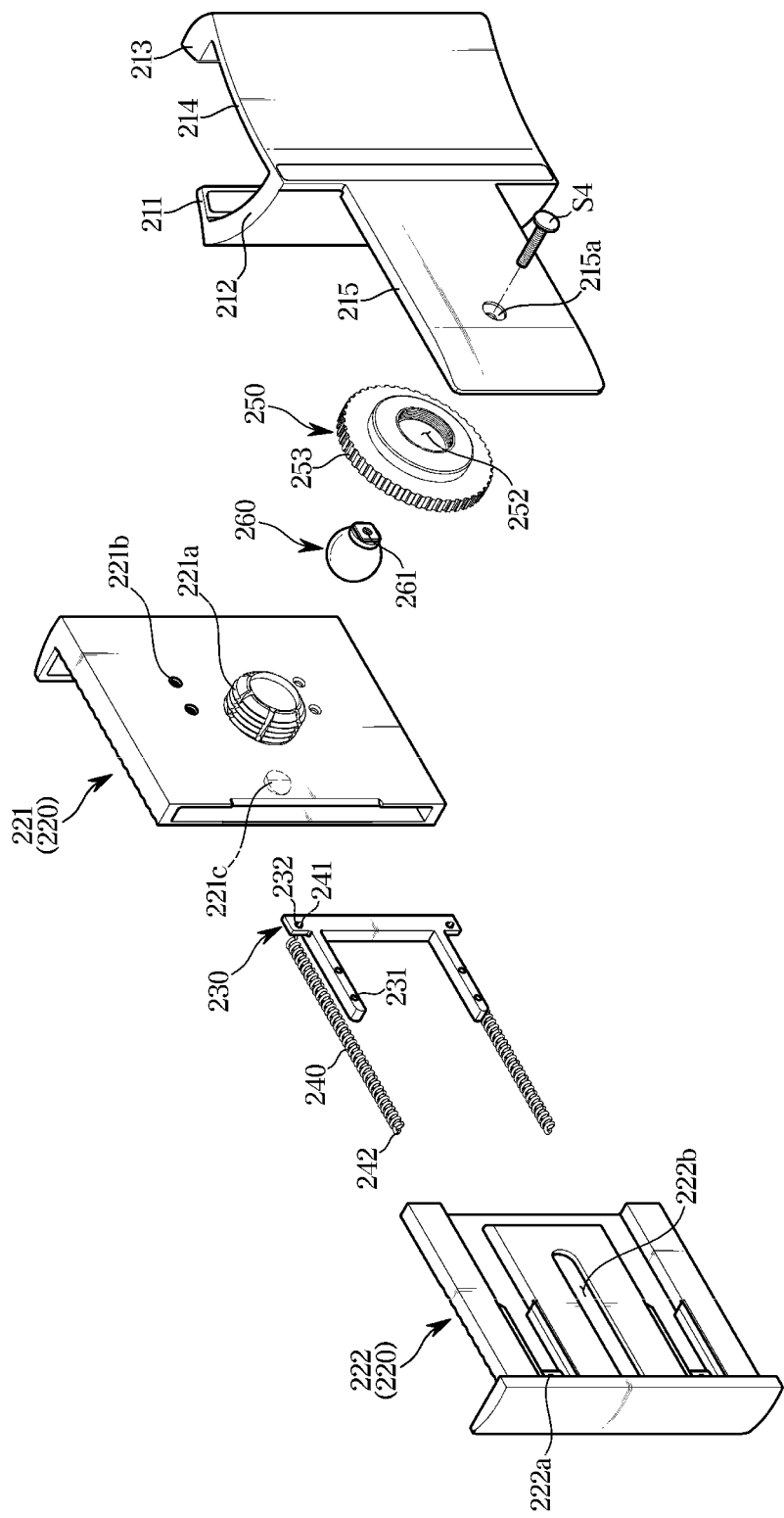
FIG. 15 shows the holding device of FIG. 14 viewed at a different angle.

FIG. 14 is an exploded view of a holding device in a display apparatus, according to another embodiment of the disclosure. FIG. 15 shows the holding device of FIG. 14 viewed at a different angle.

A detailed structure of a holding device according to another embodiment of the disclosure will now be described in connection with FIGS. 14 and 15.

Referring to FIGS. 14 and 15, the holding device 200 may include the mounting part 210 including the holder supporter 215, the first supporter 221, an elastic member supporter 230 coupled to an inner portion of the first supporter 221 and coupled to an end 241 of a second elastic member 240, and the second supporter 222 coupled to the other end 242 of the second elastic member 240.

In addition, the holding device 200 may include a ball joint part 221a, 250, and 260 to freely rotatably couple the holder 220 to the holder supporter 215.

The ball joint part 221a, 250, and 260 may include a ball housing 221a arranged on the holder supporter 215, a ball 260 inserted to the ball housing 221a, and a ball fixing member 250 coupled to the ball housing 221a to fix a position of the ball 260.

The holder 220 may be coupled to the holder supporter 215 via ball joint.

Specifically, the ball 260 may be inserted to the ball housing 221a formed on the rear surface of the first supporter 221. The ball housing 221a may receive the ball 260 inside, and screw threads may be formed on the outer surface of the ball housing 221. Alternatively, the ball housing 221a may be provided to accommodate the ball 260 inside with multiple projections with screw threads.

The ball fixing member 250 may include an inner surface having screw threads. Furthermore, the ball fixing member 250 may include a through hole 252 for a fastening member S4 to pass through. Moreover, the ball fixing member 250 may include a jagged portion 253 to produce frictional force when the user turns the ball fixing member 250. The jagged portion 253 is one of various forms to produce frictional force, and may employ any other form to produce frictional force.

The holder 220 may be freely turned until the ball fixing member 250 is coupled to the ball housing 221a by being screwed to the ball housing 221a. The user may screw the ball fixing member 250 to the ball housing 221a to fix the holder at a desired angle. Once the ball fixing member 250 is coupled to the ball housing 221a by being screwed to the ball housing 221a, a position of the holder 220 may be fixed. In order for the holder 220 to be fixed to the holder supporter 215, the fastening member S4 may be fastened to a first fastener 215a formed on the rear of the holder supporter 215 and a second fastener 261 provided at the ball 260. This enables the holder 220 to be coupled to the holder supporter 215.

Coupling between the first and second supporters 221 and 222 will now be described.

The first supporter 221 may be coupled (ball-jointed) to the holder supporter 215 by the ball joint part 221a, 250, and 260, as described above.

The first supporter 221 may include a first coupling hole 221b formed to be coupled to the elastic member supporter 230. The elastic member supporter 230 may include a second coupling hole 231 corresponding to the first coupling hole 221b. After the positions of the first coupling hole 221b and the second coupling hole 231 are matched, the elastic member supporter 230 may be coupled to the first supporter 221 by a fastening member (not shown).

A third elastic member hole 232 may be formed at the elastic member supporter 230 for the end 241 of the second elastic member 240 to be inserted thereto. The second supporter 222 may include a fourth elastic member hole 222a formed for the other end 242 of the second elastic member 240 to be inserted thereto. The second elastic member 240 may have the one end 241 linked to the elastic member supporter 230 and the other end linked to the second supporter 222. As the elastic member supporter 230 is coupled to the first supporter 221, the second elastic member 240 may exert elastic force between the first and second supporters 221 and 222. There are no limitations on types of the second elastic member 240, but in this embodiment of the disclosure, the second elastic member 240 may be a tension spring.

When the second supporter 222 is drawn out from the first supporter 221, the second elastic member 240 may exert elastic force for the second supporter 222 to be moved toward the first supporter 221. This elastic force may enable the mobile device 2 to be held between the first and second supporters 221 and 222.

The first supporter 221 may include a stopper 221c to restrict the movement range of the second supporter 222. The second supporter 222 may include a stopper groove 222b formed for the stopper 221c to be inserted thereto. As the stopper 221c is movable within the stopper groove 222b, the movement range of the second supporter 222 is limited.

Figure 16:
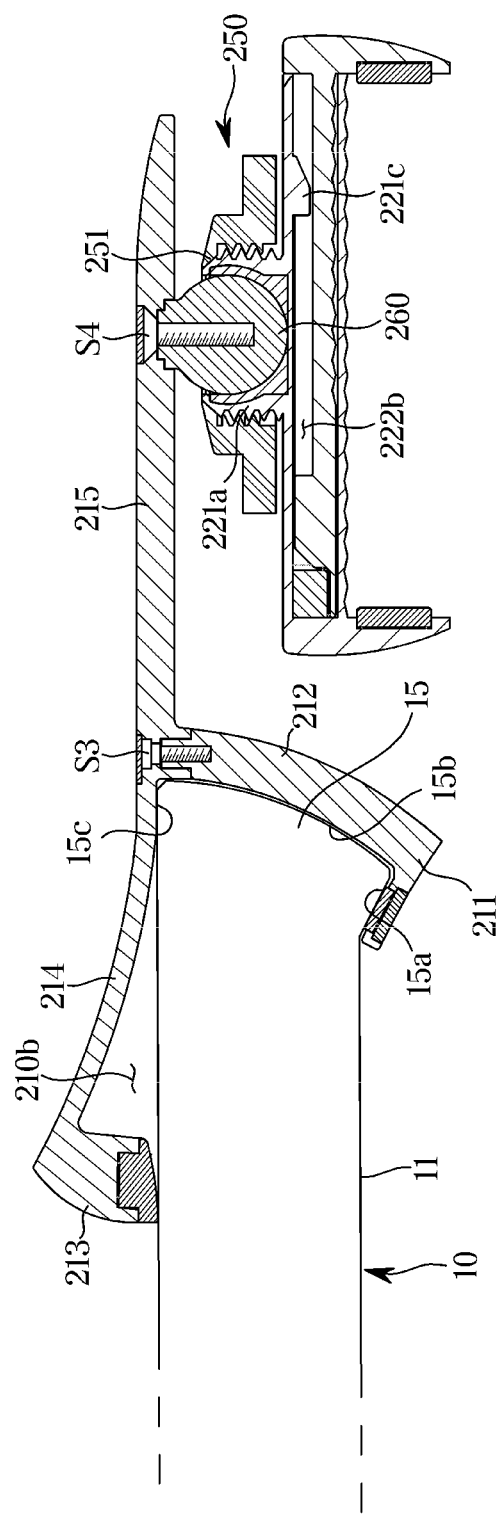
FIG. 16 is a cross-sectional view along line B-B of FIG. 11.

FIG. 16 is a cross-sectional view along line B-B of FIG. 11.

As shown in FIG. 16, the mounting part 210 may be formed with a first member defining the front supporter 211 and the side supporter 212 and a second member defining the rear supporter 213 and the elastic connector 214. The first member and the second member may be coupled to each other by a fastening member S3 as shown in FIG. 16. It is, however, an example, and in the mounting part 210, the front supporter 211, the side supporter 212, the rear supporter 213, and the elastic connector 214 may be integrated in one body.

Furthermore, referring to FIG. 16, the fastening member S4, as described above, may be fastened to the second fastener 261 of the ball 260 by passing through the first fastener 215a and the through hole 252 of the ball fixing member 250 from behind the holder supporter 215.

The user may freely turn the holder 220 or fix the holder 220 in a position by turning the ball fixing member 250 to adjust coupling power between the ball fixing member 250 and the ball housing 221a.

Moreover, the first supporter 221 may include the stopper 221c, which may be inserted to the stopper groove 222b of the second supporter 222. The second supporter 222 may be drawn out from the first supporter 221 until the stopper 221c reaches an end of the stopper groove 222b.

According to embodiments of the disclosure, the mobile device 2 and the display module 10 may be automatically paired when the mobile device 2 is put onto the holding device 100 or 200 mounted onto the display module 10.

In an embodiment of the disclosure, the mobile device 2 and the display module 10 may each include an acceleration sensor and a Bluetooth communication module. When the user approaches and tags with the acceleration sensor of the display module 10 with the mobile device 2, the acceleration sensors of the mobile device 2 and the display module 10 may detect approaching speed of each other and a touch impact produced in the tagging process.

Furthermore, according to an embodiment of the disclosure, when the mobile device 2 is put onto the holding device 100 or 200 mounted onto the display module 10, the acceleration sensor in the display module 10 may detect an impact equal to or greater than a threshold. Upon detection of the impact, the display module 10 may transmit a Bluetooth Low Energy (BLE) pairing signal to a nearby device as soon as the detection. In this case, the acceleration sensor in the mobile device 2 may also detect the impact equal to or greater than the threshold. Upon detection of the impact, the mobile device 2 may enter into a BLE paring mode and get paired with the display module 10.

Pairing between the mobile device 2 and the display module 10 may be performed using a short-range communication scheme including at least one of Bluetooth, Wireless Fidelity (Wi-Fi), Zigbee, or Near Field Communication (NFC).

When the mobile device 2 and the display module 10 are paired with each other, as described above, the screen of the mobile device 2 may be mirrored onto the display module 10 or particular content to be reproduced by the mobile device 2 may be casted onto the display module 10. Furthermore, when the mobile device 2 and the display module 10 are paired with each other, the display module 10 may provide a mirror mode using a front camera module (not shown) or a rear camera module of the mobile device 2.

Moreover, the display module 10 may obtain identification information of the mobile device 2, information of an application running on the mobile device 2, or content information to be processed in the application from the mobile device 2, and based on the obtained content information, receive the content through a 5G cellular data communication network. The display module 10 may output content being reproduced or to be reproduced by the mobile device 2 using the 5G cellular data communication network.

According to the disclosure, a display apparatus including a display module, a supporting device for rotatably supporting the display module, and a holding device for holding a mobile device onto the display module may be provided.

According to the disclosure, a display apparatus capable of using a camera function without including a camera module by using a camera module of a mobile device may be provided.

According to the disclosure, a display apparatus having a display module automatically paired with a mobile device by holding the mobile device onto a holding device may be provided.

According to the disclosure, a display apparatus capable of making touch inputs to a mobile device while the mobile device is held by a holding device of the display apparatus may be provided.

Several embodiments of the disclosure have been described above, but a person of ordinary skill in the art will understand and appreciate that various modifications can be made without departing the scope of the disclosure. Thus, it will be apparent to those ordinary skilled in the art that the true scope of technical protection is only defined by the following claims.

What is claimed is:

1. A display apparatus comprising:
   a display module;
   a support configured to rotatably support the display module, and including a motor configured to provide a driving force to rotate the display module; and
   a holding device configured to be mounted on the display module and configured to support a mobile device, the holding device comprising a mounting part configured to be mounted on the display module and a holder rotatably coupled to the mounting part and configured to support the mobile device, the holder comprising a first supporter configured to support a side of the mobile device and a second supporter configured to support an other side of the mobile device, the second supporter being configured to be elastically biased in a direction toward the first supporter to support the mobile device.

2. The display apparatus of claim 1, wherein the holding device is configured to be mounted at any location along edges of the display module.

3. The display apparatus of claim 1, wherein the holding device is configured such that when the holding device is mounted on the display module and the holder supports the mobile device, a full area of a front surface or a rear surface of the mobile device is positioned outside the display module.

4. The display apparatus of claim 1, wherein the display module comprises a frame defining edges of the display module.

5. The display apparatus of claim 4, wherein the frame comprises
   a front surface having an end extending to a screen display region of the display module,
   a side surface connected to an other end of the front surface and inclined backwards from the screen display region, the side surface being larger than the front surface, and
   a rear surface extending from the side surface toward a rear side of the display module.

6. The display apparatus of claim 5, wherein the mounting part comprises
   a front supporter configured to contact at least a portion of the front surface of the frame,
   a side supporter configured to contact at least a portion of the side surface of the frame,
   a rear supporter configured to contact at least a portion of the rear side of the display module, and
   an elastic connector connecting the side supporter to the rear supporter.

7. The display apparatus of claim 6, wherein the elastic connector includes at least a portion spaced from the display module or the frame, and having a shape swollen toward the rear side of the display module.

8. The display apparatus of claim 1, wherein the holder is coupled to the mounting part and is configured to be rotatable around a first rotation axis and a second rotation axis crossing the first rotation axis.

9. The display apparatus of claim 8, wherein the holder is configured to be rotatable 360° around the first rotation axis, and
   wherein a rotation range of the holder is configured to be limited when the holder is rotated around the second rotation axis.

10. The display apparatus of claim 1, wherein the holder is ball-jointed with respect to the mounting part and configured to be able to freely rotate with respect to the mounting part.

11. The display apparatus of claim 1, wherein the holding device further comprises a rotation guide provided between the mounting part and the holder, and a rotation stopper configured to limit a rotation range of the rotation guide.

12. The display apparatus of claim 11, wherein the rotation guide comprises
- a first rotation guide configured to be inserted into a rotation guide groove formed at the mounting part, and including a guide hole, and
- a second rotation guide configured to be coupled to the first rotation guide, the rotation stopper positioned between the first and second rotation guides, and configured to be rotatably coupled to the holder.

13. The display apparatus of claim 12, wherein the rotation stopper is configured to be movable within the guide hole, and includes a fastening projection passing through the guide hole and coupled to the rotation guide groove, and
wherein the fastening projection limits a rotation range of the first rotation guide by limiting a movement range of the guide hole.

14. The display apparatus of claim 1, wherein the second supporter is configured to be drawn out from the first supporter.

15. The display apparatus of claim 14, wherein the holder further comprises an elastic member connected to the first and second supporters and configured to elastically bias the second supporter in a direction toward the first supporter.

16. A display apparatus comprising:
- a display module including a frame defining edges of the display module;
- a support device configured to rotatably support the display module; and
- a holding device configured to support a mobile device which is configured to be paired with the display module, the holding device comprising:
  - a mounting part configured to be mounted on the frame, and
  - a holder coupled to the mounting part and configured to support the mobile device, the holder is being configured to be rotatable around a first rotation axis and a second rotation axis crossing the first rotation axis, the holder comprising a first supporter configured to support a side of the mobile device and a second supporter configured to support an other side of the mobile device, the second supporter being configured to be elastically biased in a direction toward the first supporter to support the mobile device.

17. The display apparatus of claim 16, wherein the holder is configured to rotate 360° around the first rotation axis, and wherein a rotation range of the holder is limited when the holder is rotated around the second rotation axis.

18. The display apparatus of claim 16, wherein the holding device is configured to be mounted at any location along the edges of the display module.

19. The display apparatus of claim 16, wherein the holding device is configured to support the mobile device such that a full area of a front surface or a rear surface of the mobile device is positioned outside the display module.

20. A display apparatus comprising:
- a display module including a frame defining edges of the display module;
- a support configured to rotatably support the display module; and
- a holding device configured to support a mobile device which is configured to be paired with the display module, the holding device comprising:
  - a mounting part configured to be mounted on the frame, and
  - a holder coupled to the mounting part and configured to support the mobile device, the holder is being configured to be freely rotatable on any rotation axis, the holder comprising a first supporter configured to support a side of the mobile device and a second supporter configured to support an other side of the mobile device, the second supporter being configured to be elastically biased in a direction toward the first supporter to support the mobile device.

\* \* \* \* \*